US009818773B2

(12) United States Patent
Chang

(10) Patent No.: US 9,818,773 B2
(45) Date of Patent: Nov. 14, 2017

(54) SUPPORTING DEVICE, METHOD FOR MANUFACTURING THIN FILM TRANSISTOR ARRAY SUBSTRATE AND METHOD FOR MANUFACTURING LIQUID CRYSTAL DISPLAY

(71) Applicant: HON HAI PRECISION INDUSTRY CO., LTD., New Taipei (TW)

(72) Inventor: Jen-Tsorng Chang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/150,413

(22) Filed: May 9, 2016

(65) Prior Publication Data
US 2016/0254293 A1    Sep. 1, 2016

Related U.S. Application Data

(62) Division of application No. 14/529,956, filed on Oct. 31, 2014, now Pat. No. 9,362,155.

(30) Foreign Application Priority Data

Jan. 10, 2014    (TW) .............................. 103100892 A

(51) Int. Cl.
| H01L 27/12 | (2006.01) |
| H01L 21/683 | (2006.01) |
| G02F 1/1335 | (2006.01) |
| G02F 1/1368 | (2006.01) |
| H01L 21/78 | (2006.01) |
| G02F 1/1333 | (2006.01) |

(52) U.S. Cl.
CPC ........ *H01L 27/1266* (2013.01); *G02F 1/1368* (2013.01); *G02F 1/133514* (2013.01); *H01L 21/6835* (2013.01); *H01L 21/78* (2013.01); *H01L 27/1218* (2013.01); *H01L 27/1259* (2013.01); *G02F 2001/133302* (2013.01); *G02F 2202/28* (2013.01); *H01L 2221/6835* (2013.01); *H01L 2221/68327* (2013.01); *H01L 2221/68381* (2013.01); *Y10T 428/24273* (2015.01); *Y10T 428/24777* (2015.01)

(58) Field of Classification Search
CPC .................................................. H01L 27/1214
See application file for complete search history.

(56) References Cited

U.S. PATENT DOCUMENTS

| 8,901,729 B2* | 12/2014 | Chen ...................... H01L 24/27 |
| | | 257/692 |
| 2012/0326131 A1* | 12/2012 | Han .................... H01L 51/5215 |
| | | 257/40 |

FOREIGN PATENT DOCUMENTS

| TW | M375065 U1 | 3/2010 |
| TW | 201216234 A1 | 4/2012 |

\* cited by examiner

*Primary Examiner* — Yu-Hsi D Sun
(74) *Attorney, Agent, or Firm* — Steven Reiss

(57) ABSTRACT

A supporting device includes a main body and a ring-shaped glue layer. The main body includes a top surface and a bottom surface opposite to the top surface. The top surface defines a first groove. The first groove is substantially ring-shaped. The glue layer is arranged in the top surface and surrounds the first groove. A plurality of glass-frits is distributed in the glue layer. A thickness of the main body is approximately in a range from 0.5 millimeters to 0.8 millimeters. The glue layer is directly attached the top surface.

2 Claims, 9 Drawing Sheets

SUPPORTING DEVICE, METHOD FOR MANUFACTURING THIN FILM TRANSISTOR ARRAY SUBSTRATE AND METHOD FOR MANUFACTURING LIQUID CRYSTAL DISPLAY

This application is a divisional application of a commonly-assigned application entitled "SUPPPORTING DEVICE, METHOD FOR MANUFACTURING THIN FILM TRANSISTOR ARRAY SUBSTRATE AND METHOD FOR MANUFACTURING LIQUID CRYSTAL DISPLAY", filed on Oct. 31, 2014 with application Ser. No. 14/529,956. The disclosure of the above-identified application is incorporated herein by reference.

FIELD

The subject matter herein generally relates to liquid crystal display (LCD) technologies and, particularly, to a supporting device, a method for manufacturing a thin film transistor (TFT) array substrate and a method for manufacturing an LCD.

BACKGROUND

The use of LCDs has many advantages, and have been widely applied in everyday life, in devices such as computers, or televisions. A liquid crystal panel is a key component of the LCD and produces thousands of volts of static electricity. The liquid crystal panel includes a TFT array substrate, a color filter substrate opposite to the TFT array substrate, and a liquid crystal layer sandwiched between the TFT array substrate and the color film substrate.

BRIEF DESCRIPTION OF THE DRAWINGS

Implementations of the present technology will now be described, by way of example only, with reference to the attached figures.

DETAILED DESCRIPTION

Figure 1:
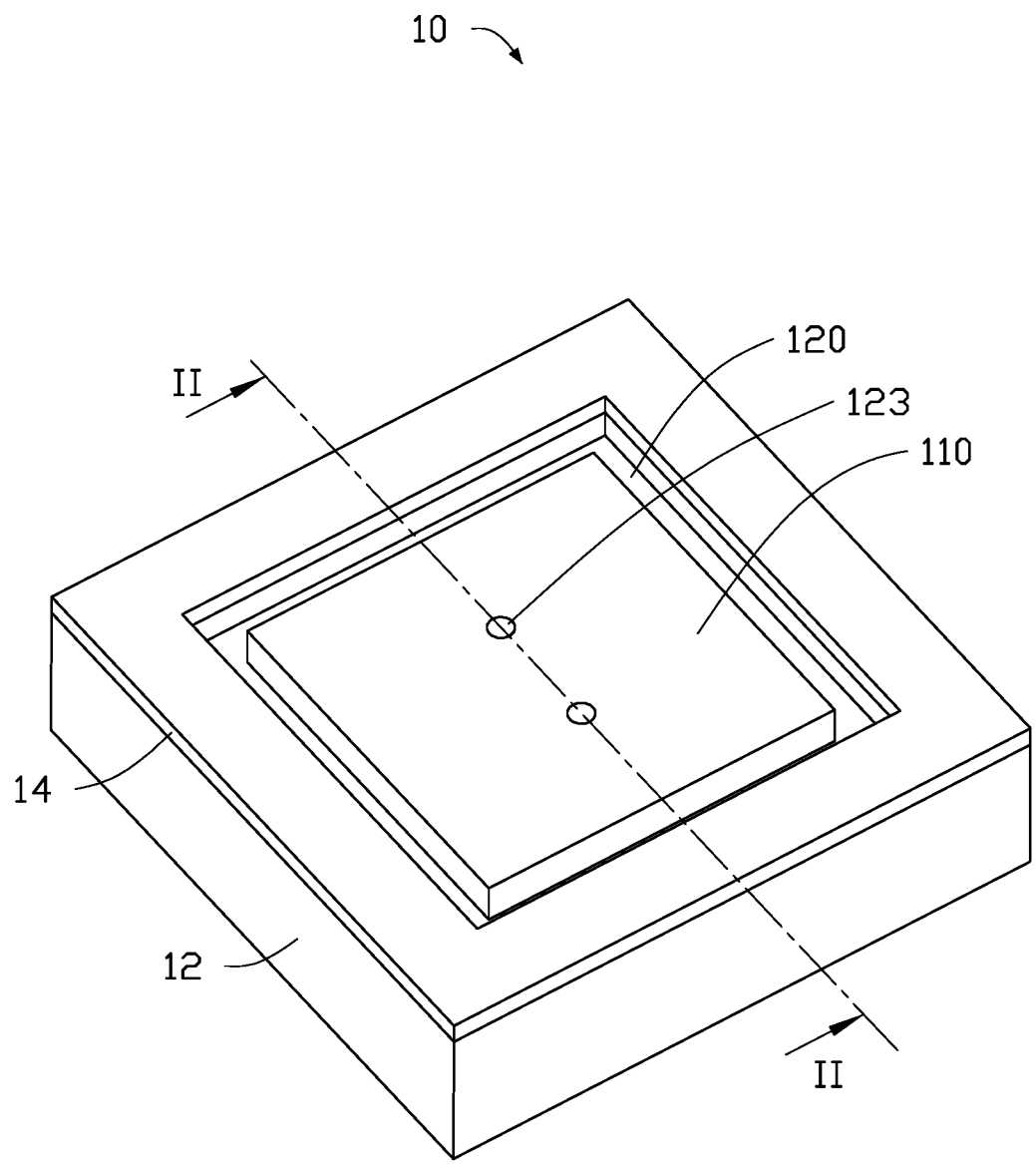
FIG. 1 is an isometric view of a first example embodiment of a supporting device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "substantially" is defined to mean essentially conforming to the particular dimension, shape, or other feature that is modified such that exactness does not apply. For example, substantially cylindrical means that the object resembles a cylinder, but can have one or more deviations from a true cylinder. The term "comprising," means "including, but not necessarily limited to" and specifically indicates open-ended inclusion or membership in the so-described combination, group, series and the like. The references "a plurality of" and "a number of" mean "at least two."

The present disclosure is described in relation to a supporting device. The supporting device includes a main body and a ring-shaped glue layer. The main body includes a top surface and a bottom surface opposite to the top surface. The top surface defines a first groove. The first groove is substantially ring-shaped. The glue layer is arranged in the top surface and surrounds the first groove. A plurality of glass-frits are distributed in the glue layer.

The present disclosure is described in relation to a method for manufacturing a TFT array substrate. The method includes providing a supporting device and an ultra-thin glass. The supporting device includes a main body and a ring-shaped glue layer. The main body includes a top surface and a bottom surface opposite to the top surface. The top surface defines a first groove. The first groove is substantially ring-shaped. The glue layer is arranged in the top surface and surrounds the first groove. A plurality of glass-frits are distributed in the glue layer. The ultra-thin glass is fixed to the supporting device. The ultra-thin glass includes a to-be-machined area surrounded by the first groove. A TFT array in the to-be-machined area is formed using a TFT array substrate process. A TFT array substrate is formed by cutting the ultra-thin glass along the first groove.

The present disclosure is described in relation to a method for manufacturing an LCD. The method includes providing a first supporting device and an ultra-thin glass. The first supporting device includes a first main body and a ring-shaped first glue layer. The first main body includes a first top surface and a first bottom surface opposite to the first top surface. The first top surface defines a first groove. The first groove is substantially ring-shaped. The first glue layer is arranged in the first top surface and surrounds the first groove. A plurality of glass-frits are distributed in the first glue layer. The ultra-thin glass is fixed to the first supporting device. The ultra-thin glass includes a to-be-machined area surrounded by the first groove of the first supporting device. A TFT array in the to-be-machined area is formed using a TFT array substrate process. A second supporting device and a color filter substrate are provided. The second supporting device includes a second main body and a ring-shaped second glue layer. The second main body includes a second top surface and a second bottom surface opposite to the second top surface. The second top surface defines a first groove. The first groove of the second main body is substantially ring-shaped. The second glue layer is arranged in the second top surface and surrounds the first groove of the second main body. A plurality of glass-frits are distributed in the second glue layer. A portion of the color filter substrate surrounded by the first groove of the second main body is defined as a perfusion area. A liquid crystal layer is formed between the perfusion area and the TFT array. An LCD is formed by cutting the ultra-thin glass along the first groove of the first main body and by cutting the color filter substrate along the first groove of the second main body.

FIG. 1 illustrates a first example embodiment of a supporting device 10. The supporting device 10 includes a main body 12 and a glue layer 14.

Figure 2:
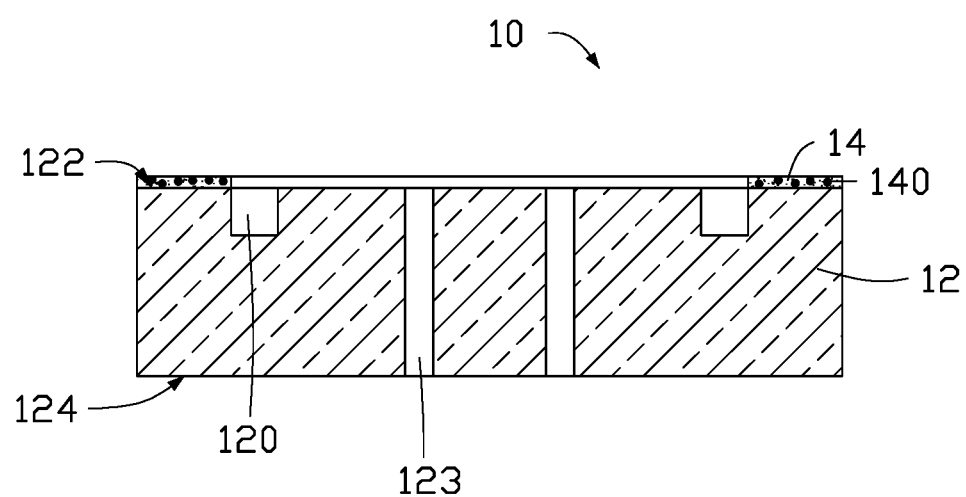
FIG. 2 is a cross-sectional view taken along line II-II of the supporting device of FIG. 1.

FIG. 2 illustrates that the main body 12 is substantially a cuboidal and includes a top surface 122 and a bottom surface 124. The top surface 122 and the bottom surface 124 are positioned at opposite sides of the main body 12. The top surface 122 is substantially parallel to the bottom surface 124. A first groove 120 is defined in the top surface 122. The first groove 120 does not penetrate the bottom surface 124. In one embodiment, the first groove 120 is substantially ring-shaped. A portion surrounded by the first groove 120 is defined as an effective area 110. The main body 12 defines a number of through holes 123. The through holes 123 are located in the effective area 110 and penetrate the top surface 122 and the bottom surface 124. In this embodiment, the main body 12 is made of glass. A thickness of the main body 12 is approximately in a range from 0.5 millimeters to 0.8 millimeters.

The glue layer 14 is a substantially ring-shaped plate. The glue layer 14 is directly attached to the top surface 122 and surrounds the first groove 120. The first groove 120 can receive extra glue when the glue layer 14 is attached to the top surface 122, such that glue cannot influence the components in the effective area 110. A plurality of glass-frits 140 are distributed in the glue layer 14. In this embodiment, the glue layer 14 is made of a thermal decomposition glue, which can be solidified in certain temperatures and can be totally decomposed at a temperature higher than 600 degrees Celsius. A thickness of each of the glass-frits 140 is substantially in a range from 5 nanometers to 50 micrometers. The glass-frits 140 are configured to stick an ultra-thin glass 16 (shown in FIG. 4) and the main body 12 together.

Figure 3:
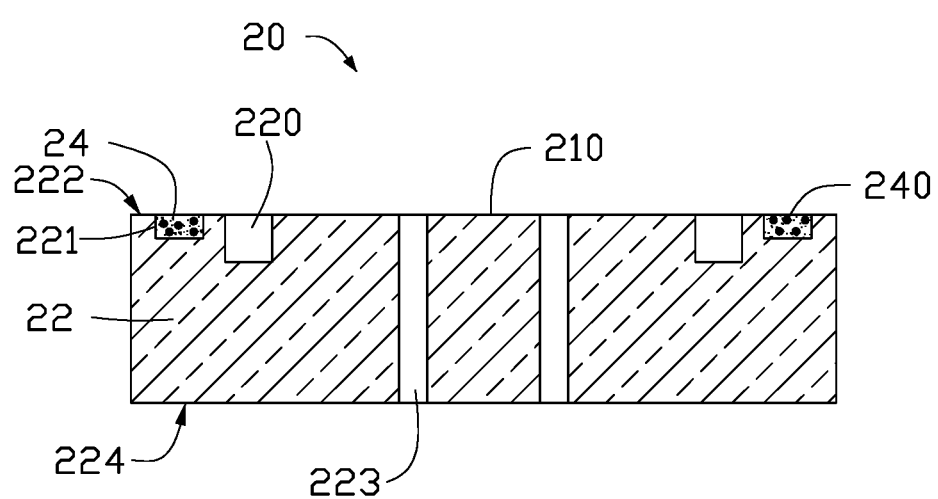
FIG. 3 is a cross-sectional view of a second example embodiment of a supporting device.

FIG. 3 illustrates a second example embodiment of a supporting device 20. The supporting device 20 includes a main body 22 and a glue layer 24.

The main body 22 is substantially cuboidal and includes a top surface 222 and a bottom surface 224. The top surface 222 and the bottom surface 224 are positioned at opposite sides of the main body 22. The top surface 222 is substantially parallel to the bottom surface 224. A first groove 220 and a second groove 221 are defined in the top surface 222. The first groove 220 and the second groove 221 do not penetrate the bottom surface 224. In one embodiment, the first groove 220 and the second groove 221 are substantially ring-shaped. A portion surrounded by the first groove 220 is defined as an effective area 210. The second groove 221 surrounds the first groove 220 and is spaced apart from the first groove 220. The main body 22 defines a plurality of through holes 223. The through holes 223 are located in the effective area 210 and penetrate the top surface 222 and the bottom surface 224. In this embodiment, the main body 22 is made of glass. A thickness of the main body 22 is approximately in a range from 0.5 millimeters to 0.8 millimeters.

The glue layer 24 is a substantially ring-shaped plate. The glue layer 24 is received in the second groove 221. The glue layer 24 is coplanar with the top surface 222. The first groove 220 can receive extra glue when the glue layer 24 fills in the second groove 221, such that glue cannot influence the components in the effective area 210. A plurality of glass-frits 240 are distributed in the glue layer 24. In this embodiment, the glue layer 24 is made of a thermal decomposition glue, which can be solidified in certain temperatures and can be totally decomposed at a temperature higher than 600 degrees Celsius. The thickness of each of the glass-frits 240 is substantially in a range from 5 nanometers to 50 micrometers. The glass-frits 240 are configured to stick an ultra-thin glass 16 (shown in FIG. 4) and the main body 22 together.

Figure 4:
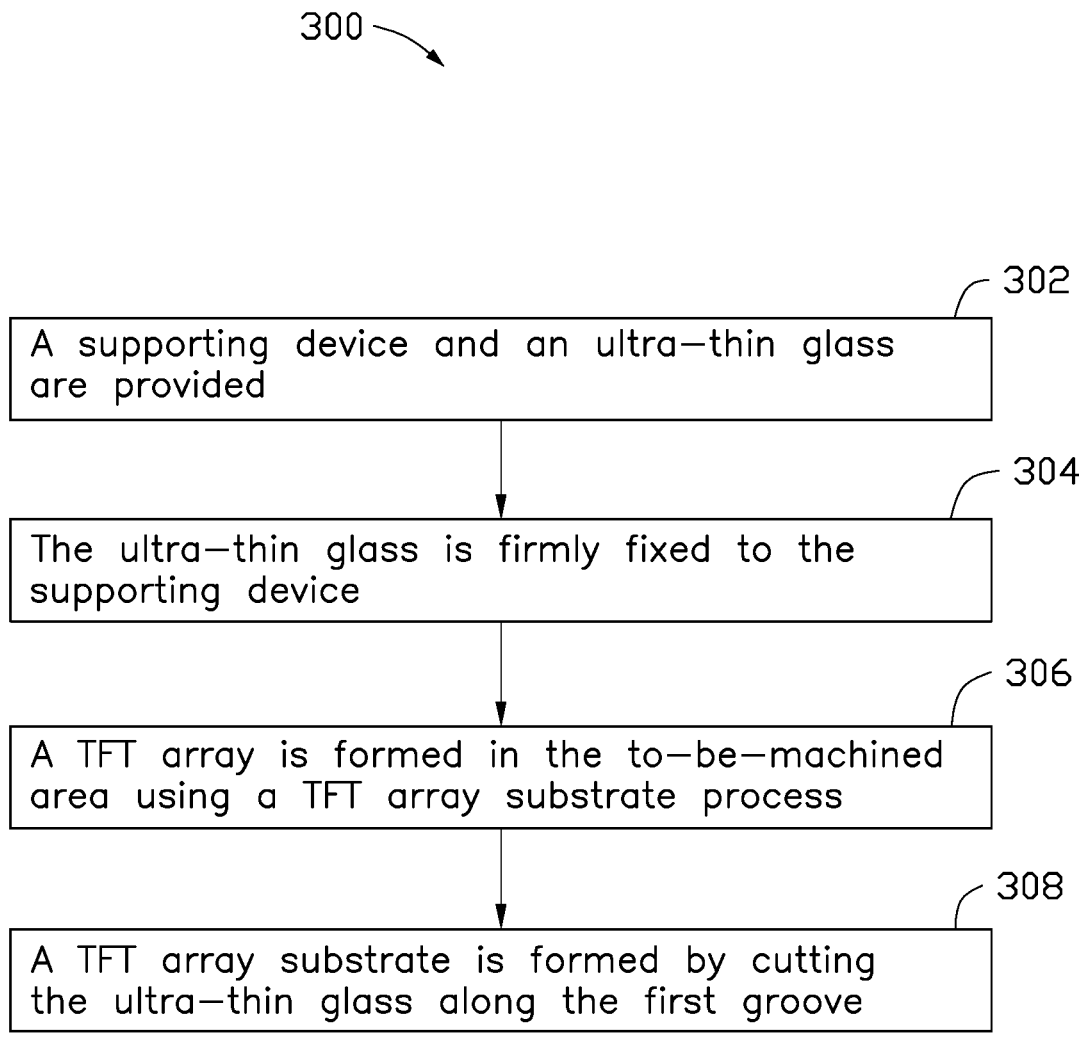
FIG. 4 is a flowchart of an example method for manufacturing a TFT array substrate using the supporting device of FIG. 3.

FIG. 4 shows a flowchart presented in accordance with an example embodiment. The example method 300 for making a TFT array substrate 400 (shown in FIG. 6) is provided by way of an example, as there are a variety of ways to carry out the method. The method 300 described below can be carried out using the configurations illustrated in FIGS. 2 and 3, for example, and various elements of these figures are referenced in explaining example method 300. Each block shown in FIG. 4 represents one or more processes, methods or subroutines, carried out in the exemplary method 300. Additionally, the illustrated order of blocks is by example only and the order of the blocks can change according to the present disclosure. The exemplary method 300 can begin at block 302.

Figure 5:
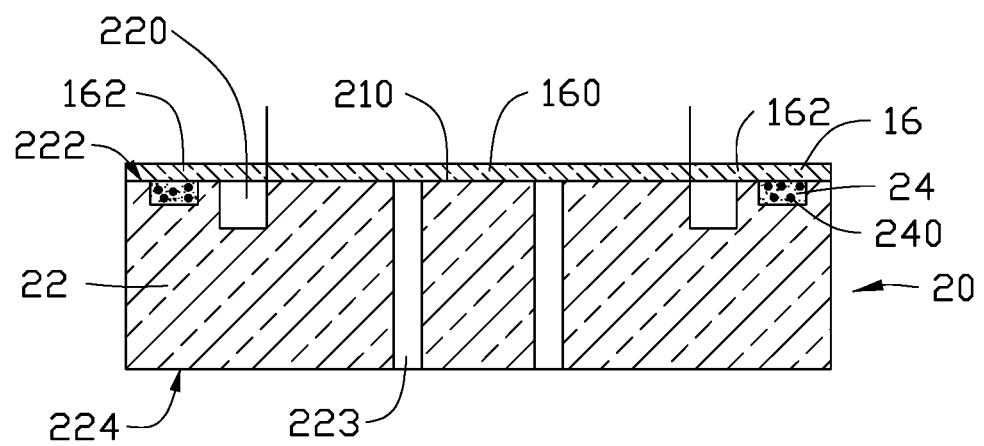
FIG. 5 is a cross-sectional view, showing an ultra-thin glass is attached to the supporting device of FIG. 3.

At block 302, a supporting device 20 and an ultra-thin glass 16 are provided. FIG. 5 illustrates that the configuration of the supporting device 20 is described in the second example. The thickness of the ultra-thin glass 16 is approximately in a range from 0.02 millimeters to 0.2 millimeters. The ultra-thin glass 16 includes a rectangular to-be-machined area 160 in a central portion and a ring-shaped supporting area 162 surrounding the to-be-machined area 160.

At block 304, the ultra-thin glass 16 is firmly fixed to the supporting device 20. In detail, the to-be-machined area 160 is aligned with the effective area 210. The ultra-thin glass 16 totally contacts the top surface 222. The supporting area 162 is firmly adhered to the supporting device 20 via the glue layer 24. During this process, extra glue is pressed and flows into the first groove 220, such that glue cannot influence the components in the effective area 210 and in the to-be-machined area 160.

At block 306, a TFT array is formed in the to-be-machined area 160 using a TFT array substrate process. During this process, a chemical vapor deposition (CVD) method or a physical vapor deposition (PVD) method is applied at a high temperature. The glue layer 24 is decomposed in the high temperature, and the glass-frits 240 can adhere the ultra-thin glass 16 and the supporting device 20 together. During the TFT array substrate process, air can be exhausted through the through holes 223, thereby avoiding deformation of the ultra-thin glass 16.

Figure 6:
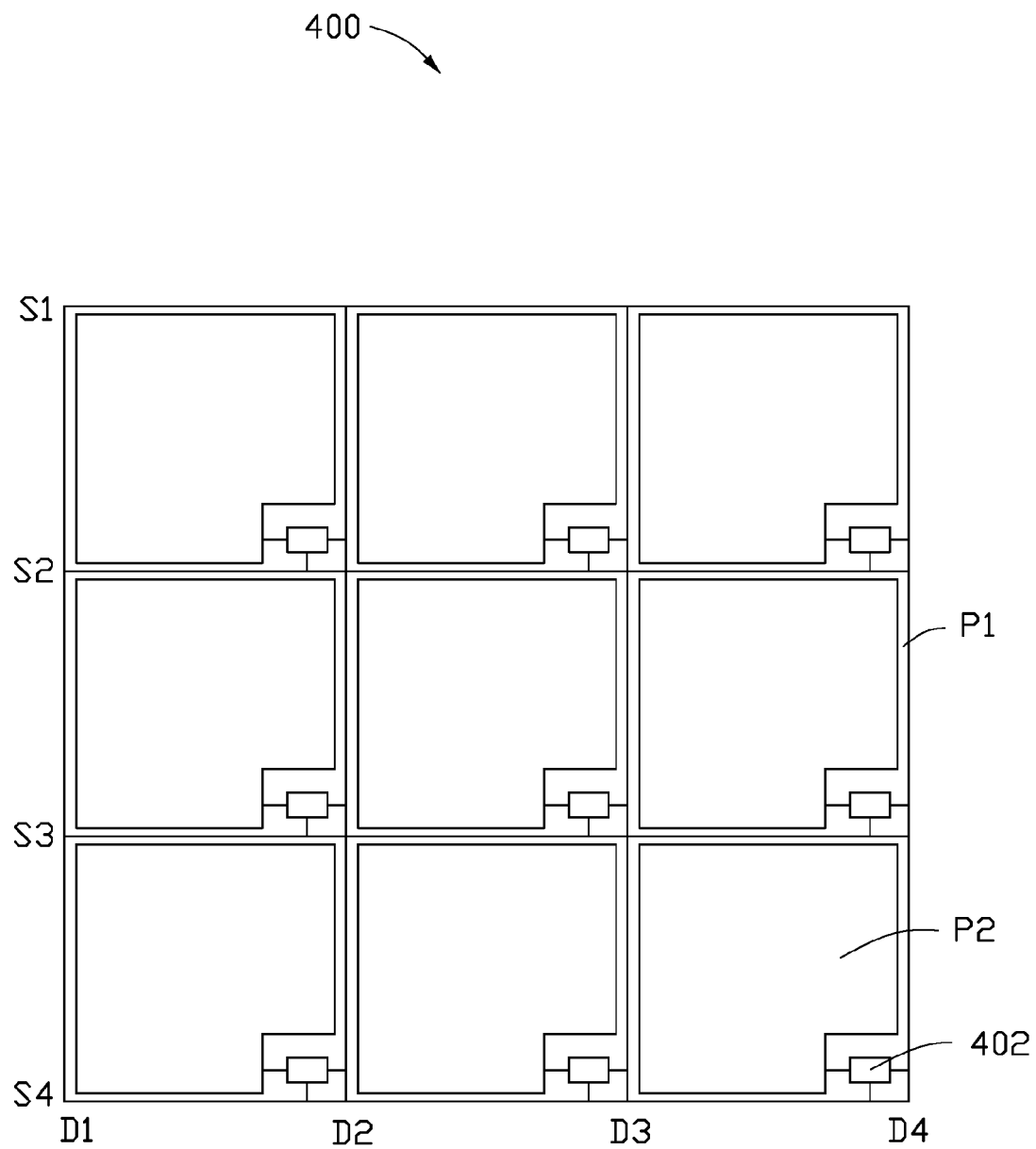
FIG. 6 is a diagrammatic view of the TFT array substrate.

At block 308, a TFT array substrate 400 is formed by cutting the ultra-thin glass 16 along the first groove 220. FIG. 6 shows that the TFT array substrate 400 includes a number of data lines D1, D2, D3, and D4, a number of scan lines S1, S2, S3, and S4, and a number of pixels P1 formed by the data lines D1, D2, D3, and D4 and the scan lines S1, S2, S3, and S4. Each pixel P1 includes a TFT 402 and a pixel electrode P2. The gate electrode of the TFT 402 is connected to a corresponding scan line. The source electrode of the TFT 402 is connected to a corresponding data line. The drain electrode of the TFT 402 is connected to the pixel electrode P2.

Figure 7:
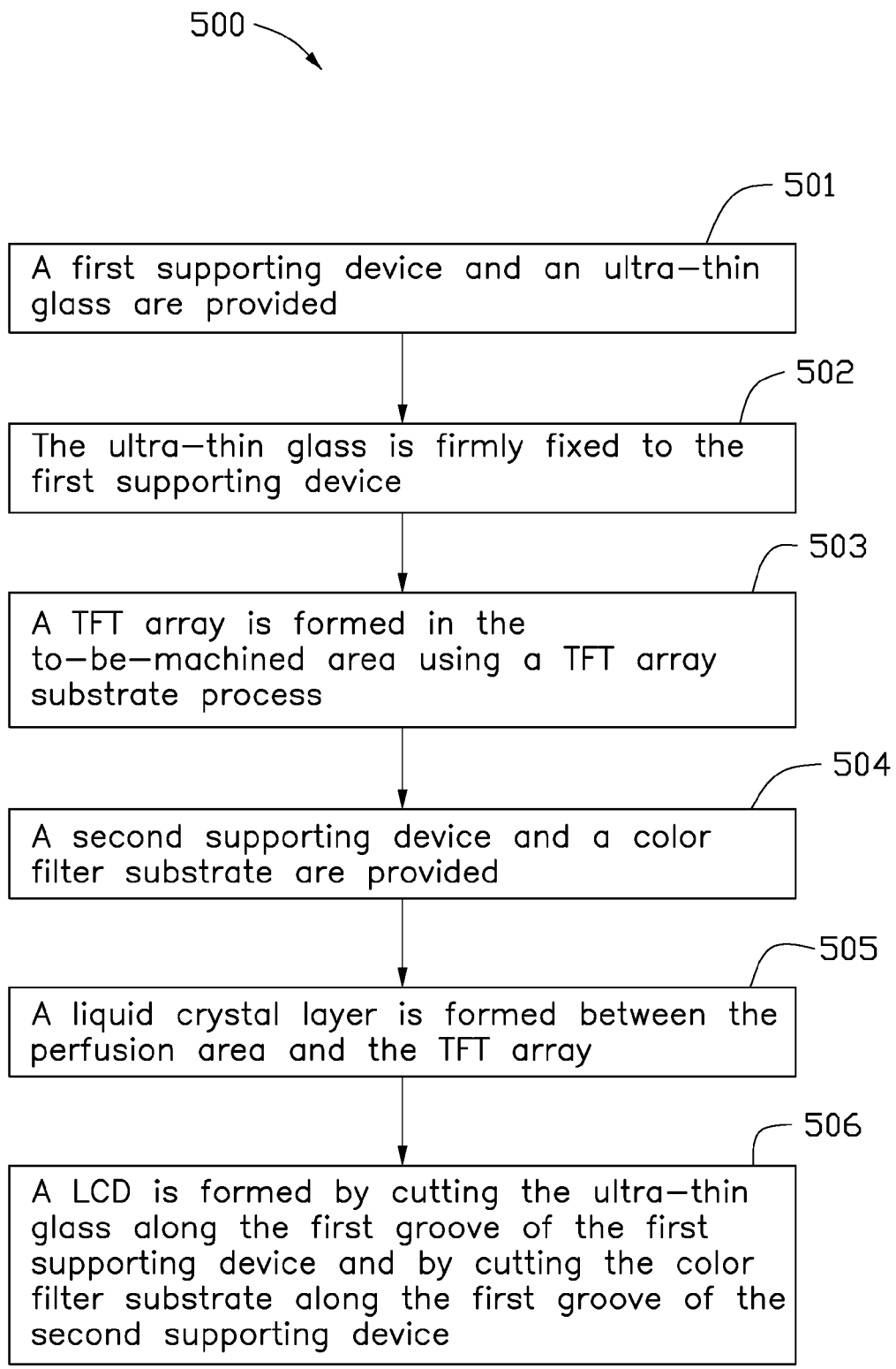
FIG. 7 a flowchart of an example method for manufacturing an LCD using the supporting device of FIG. 3.
Figure 9:
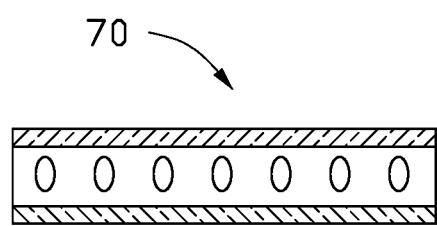
FIG. 9 is diagrammatic view of the LCD.

FIG. 7 shows a flowchart presented in accordance with an example embodiment. The example method 500 for making an LCD 70 (shown in FIG. 9) is provided by way of example, as there are a variety of ways to carry out the method. The method 500 described below can be carried out using the configurations illustrated in FIGS. 2 and 3, for example, and various elements of these figures are referenced in explaining example method 500. Each block shown in FIG. 7 represents one or more processes, methods or subroutines, carried out in the exemplary method 500. Additionally, the illustrated order of blocks is by example only and the order of the blocks can change according to the present disclosure. The exemplary method 500 can begin at block 501.

Figure 8:
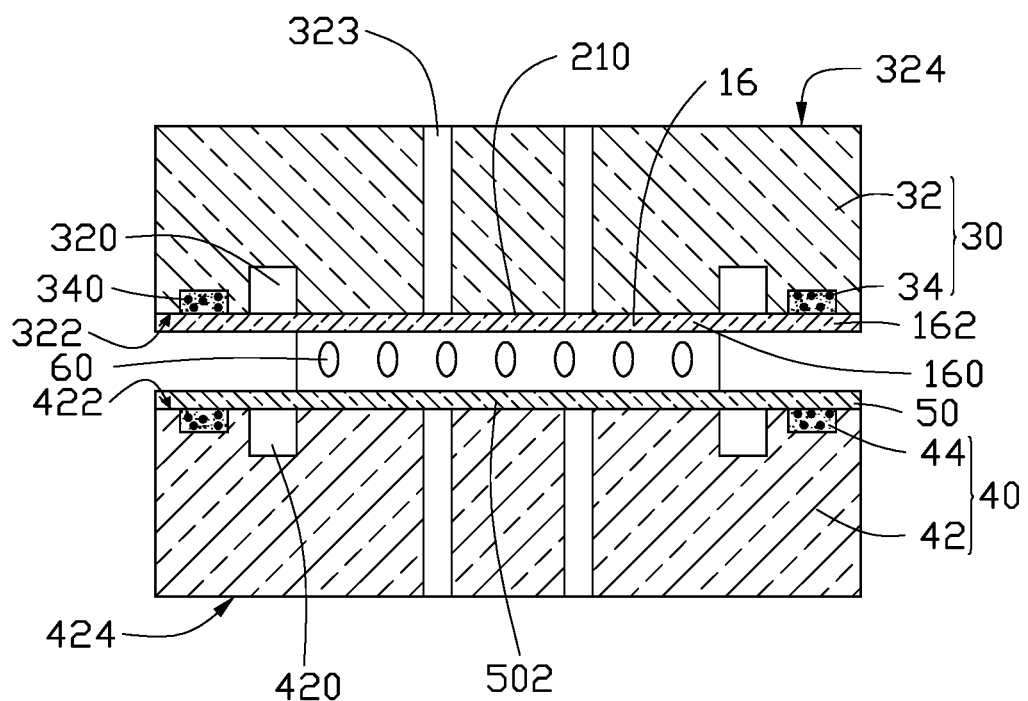
FIG. 8 is a cross-sectional view, showing an ultra-thin glass attached to a first supporting device, a color filter substrate attached to a second supporting device, and a liquid crystal layer sandwiched between the ultra-thin glass and the color filter substrate.

At block 501, a first supporting device 30 and an ultra-thin glass 16 are provided. FIG. 8 shows that the configuration of the first supporting device 30 is the same as that of the supporting device 20 described in the second example. The thickness of the ultra-thin glass 16 is approximately in a range from 0.02 millimeters to 0.2 millimeters. The ultra-thin glass 16 includes a rectangular to-be-machined area 160 in a central portion thereof and a ring-shaped supporting area 162 surrounding the to-be-machined area 160.

At block 502, the ultra-thin glass 16 is firmly fixed to the first supporting device 30. In detail, the to-be-machined area 160 is aligned with the effective area 210. The ultra-thin glass 16 totally contacts the first top surface 322. The supporting area 162 is firmly adhered to the first supporting device 30 via the first glue layer 34. During this process, extra glue is pressed and flows into the first groove 320, such that glue cannot influence the components in the effective area 210 and in the to-be-machined area 160.

At block 503, a TFT array is formed in the to-be-machined area 160 using a TFT array substrate process. During this process, a chemical vapor deposition (CVD) method or a physical vapor deposition (PVD) method is applied at a high temperature. The first glue layer 34 is decomposed in the high temperature, and the first glass-frits 340 can adhere the ultra-thin glass 16 and the first supporting device 30 together. During the TFT array substrate process, air can be exhausted through the first through holes 323, thereby avoiding deformation of the ultra-thin glass 16.

At block 504, a second supporting device 40 and a color filter substrate 50 are provided. The configuration of the second supporting device 40 is the same as that of the supporting device 20 described in the second example. The color filter substrate 50 is firmly fixed to the second supporting device 40 via the second glue layer 44. A portion of the color filter substrate 50 surrounded by the first groove 420 is defined as a perfusion area 502.

At block 505, a liquid crystal layer 60 is formed between the perfusion area 502 and the TFT array.

At block 506, an LCD is formed by cutting the ultra-thin glass 16 along the first groove 320 and by cutting the color filter substrate 50 along the first groove 420.

The embodiments shown and described above are only examples. Many details are often found in the art such as the other features of a supporting device, a method for manufacturing a TFT substrate, and a method for manufacturing an LCD. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in the matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A supporting device comprising:
   a main body comprising a top surface and a bottom surface opposite to the top surface, the top surface defining a first groove, the first groove being substantially ring-shaped; and
   a ring-shaped glue layer, the glue layer arranged in the top surface and surrounding the first groove, and a plurality of glass-frits distributed in the glue layer,
   wherein a thickness of the main body is approximately in a range from 0.5 millimeters to 0.8 millimeters, and the glue layer is directly attached to the top surface;
   wherein a thickness of each of the glass-frits is substantially in a range from 5 nanometers to 50 micrometers; and
   wherein a portion surrounded by the first groove is defined as an effective area, the main body defines a plurality of through holes, and the through holes are located in the effective area.

2. A supporting device comprising:
   a main body comprising a top surface and a bottom surface opposite to the top surface, the top surface defining a first groove, the first groove being substantially ring-shaped; and
   a ring-shaped glue layer, the glue layer arranged in the top surface and surrounding the first groove, and a plurality of glass-frits distributed in the glue layer,
   wherein a thickness of the main body is approximately in a range from 0.5 millimeters to 0.8 millimeters, and the glue layer is directly attached to the top surface;
   wherein a portion surrounded by the first groove is defined as an effective area, the main body defines a plurality of through holes, and the through holes are located in the effective area.

\* \* \* \* \*